(12) United States Patent
Sanzo (10) Patent No.: US 6,570,748 B2
(45) Date of Patent: May 27, 2003

(54) METHOD AND APPARATUS FOR INDICATING AN OVER-CURRENT CONDITION

(75) Inventor: Christopher J. Sanzo, Providence, RI (US)

(73) Assignee: Sipex Corporation, Billerica, MA (US)

( * ) Notice: Subject to any disclaimer, the term of this patent is extended or adjusted under 35 U.S.C. 154(b) by 82 days.

(21) Appl. No.: 09/902,336

(22) Filed: Jul. 10, 2001

(65) Prior Publication Data

US 2002/0021225 A1 Feb. 21, 2002

Related U.S. Application Data

(60) Provisional application No. 60/217,949, filed on Jul. 13, 2000.

(51) Int. Cl.[7] .................................. H02M 5/42
(52) U.S. Cl. ..................................... 361/93.1
(58) Field of Search .................... 361/7, 78, 79, 361/86, 87, 91.1, 93.1, 93.9, 111; 363/50, 56.01, 56.12

(56) References Cited

U.S. PATENT DOCUMENTS

| | | | | |
|---|---|---|---|---|
| 5,831,803 A | * | 11/1998 | Wynn et al. | 361/7 |
| 5,892,647 A | | 4/1999 | Mizoe | 361/101 |
| 5,896,263 A | | 4/1999 | Terdan et al. | 361/101 |
| 5,903,422 A | | 5/1999 | Hosokawa | 361/93 |
| 5,959,464 A | | 9/1999 | Qualich | 324/769 |
| 6,104,583 A | * | 8/2000 | Wynn et al. | 361/7 |
| 6,108,182 A | | 8/2000 | Pullen | 361/89 |
| 6,160,387 A | | 12/2000 | Moraghan | 323/277 |
| 6,366,068 B1 | * | 4/2002 | Morishita | 323/282 |

* cited by examiner

*Primary Examiner*—Matthew Nguyen
(74) *Attorney, Agent, or Firm*—Testa, Hurwitz & Thibeault, LLP (57) ABSTRACT

The invention relates to a method of to indicate an over-current condition in a switching circuit. The method includes monitoring a monitor voltage from the switching circuit, charging an energy storage device in response to the monitor voltage and a reference voltage, and generating an indication signal in response to the charging of the storage device. The method can be used to detect over-current conditions during high-speed switching and when transient load conditions and supply line noise are present.

23 Claims, 6 Drawing Sheets

METHOD AND APPARATUS FOR INDICATING AN OVER-CURRENT CONDITION

CROSS-REFERENCE TO RELATED APPLICATIONS

This application claims priority to provisional U.S. patent application Ser. No. 60/217,949 which was filed Jul. 13, 2000.

FIELD OF THE INVENTION

This invention relates generally to the field of integrated circuits. More specifically, the invention relates to a method and apparatus for indicating an over-current condition in a switching circuit.

BACKGROUND OF THE INVENTION

Figure 1:
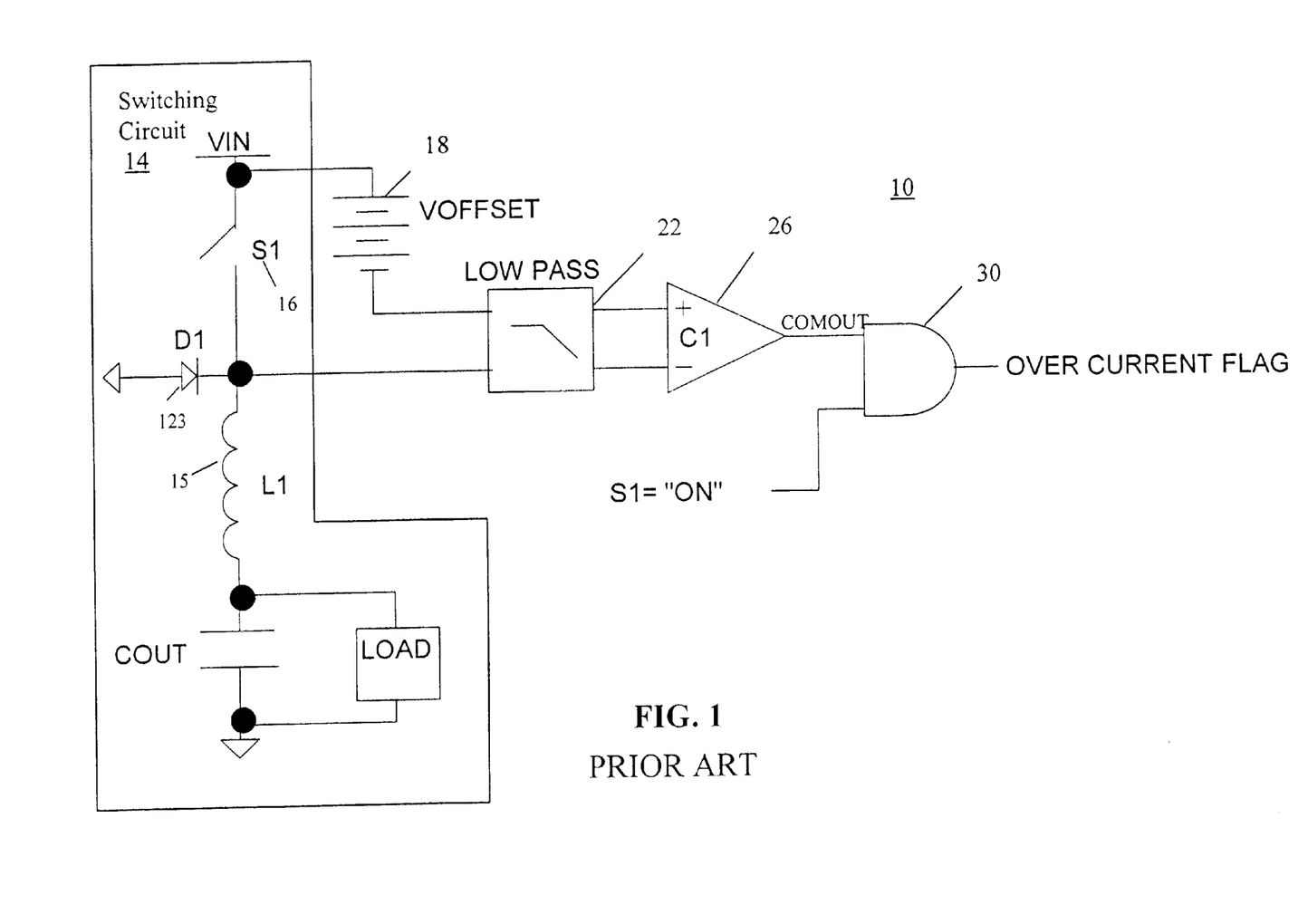
FIG. 1 is a block diagram of an embodiment of an over-current detection circuit known to the prior art.

FIG. 1 depicts, at a high level, a system 10 known to the prior art for indicating an over-current condition in a switching circuit 14. Such systems are disclosed, for example, in U.S. Pat. No. 5,903,422 to Hosokawa and U.S. Pat. No. 6,108,182 to Pullen. The switching circuit 14 shown is a DC to DC buck converter that maintains a predefined voltage level across the load by switching current through an inductor 15. The switching of current is done using a switch 16, which can be for example a P-channel or N-channel field effect transistor ("FET") device. The system 10 for indicating an over-current condition includes an offset voltage source 18, a low-pass filter 22, a comparator 26, and a logic element 30. The comparator 26 compares the voltages applied to its positive and negative terminals and generates a voltage difference representing the voltage drop across the switch 16 in the switching circuit 14. The offset voltage (VOFFSET) generated by source 18 is added to the input voltage ($V_{IN}$) to set the voltage level at which the comparator 26 output signal (COMOUT) transitions from a low state to a high state. The low-pass filter 22 across the input terminals of the comparator 26 filters out high-frequency switching noise to avoid false indications of over-current. A problem with the use of the low-pass filter 22 is that the over-current system 10 is unusable during small "ON" times of the switch 16. Activating the switch 16 for short times is desirable in switch mode power converters in order to keep external component sizes small. The system 10 uses the logic element 30 to ensure that any indication of an over-current condition is made only when the switch 16 is in a closed position (i.e., "ON"). A problem with this approach is that all the circuitry from the switching circuit 14 to the logic element 30 must process all transients and noise conditions. The present invention addresses the disadvantages of the above techniques.

SUMMARY OF THE INVENTION

It is therefore an object of the invention to detect over-current conditions for pulses with narrow "ON" times and to filter out noise effectively. This ability eliminates the need for input filtering of the over-current detection input terminals and allows for high switching speeds and smaller external components. The technique protects against false triggering caused by a transient load condition or supply line noise. The technique combines the advantages of pulse by pulse over-current detection with the noise immunity of an average over-current detection. For example, ten 1 µs pulses are equivalent to twenty 500 ns pulses or one 10 µs pulse of similar magnitude, however, depending on the period, each scenario requires a different fault duration to trigger an indication. The fault indication effectively indicates the average power in the switch. In one embodiment the CMOS trip threshold is dependent on the supply voltage, the over-current technique is immune to false triggering due to changes in line voltage.

In one aspect the invention relates to a method to indicate an over-current condition in a switching circuit. The method includes monitoring a monitor voltage from the switching circuit, charging an energy storage device in response to the monitor voltage and a reference voltage, and generating an indication signal in response to the charging of the storage device. In another embodiment, the method further includes charging the energy storage device at a charge rate in response to the monitor voltage and a reference voltage, and discharging the energy storage device at a discharge rate. In another embodiment, the discharge rate is less than the charge rate.

In another embodiment, the method further includes receiving an enable signal, wherein the charging step includes charging the energy storage device in response to the monitor voltage, the reference voltage and the enable signal. In another embodiment, the method further includes generating the enable signal when a switching device within the switching circuit is in a closed state. In another embodiment, the method further includes determining the monitor voltage in response to a voltage drop across a switching device in the switching circuit. In another embodiment, the method further includes generating an indication signal in response a storage voltage of the energy storage device exceeding a second reference voltage. In another embodiment, the method further includes controlling the switching circuit in response to the indication signal. In another embodiment, the switching circuit is a synchronous, DC to DC converter.

In another aspect, the invention relates to a system to indicate an over-current condition in a switching circuit. The system includes a control module, an energy storage module and an indicator module. The control module has a first terminal configured to receive a monitor voltage from the switching circuit, and a second terminal, wherein the control module generates at the second terminal a control signal in response to the monitor voltage and a first reference voltage. The energy storage module has a first terminal in communication with the second terminal of the control module, a second terminal, and an energy storage device in communication with the second terminal of the energy storage module, wherein the energy storage device is charged in response to the control signal, thereby generating a storage voltage at the second terminal. The indicator module has a first terminal in communication with the second terminal of the energy storage module, and a second terminal, wherein the indicator module generates at the second terminal an indication signal in response to the charge signal.

In one embodiment, the control module further includes a third terminal configured to receive an enable signal, wherein the control module generates at the second terminal a control signal in response to the monitor voltage, the first reference voltage and the enable signal. In another embodiment the monitor voltage is a first monitor voltage and the control module further includes a third terminal, an amplifier and a comparator. The third terminal is configured to receive a second monitor voltage. The amplifier includes a first terminal in communication with the first terminal of the control module, a second terminal in communication with the third terminal of the control module, and a third terminal. The comparator includes a first terminal in communication with the third terminal of the amplifier, a second terminal in communication with the second terminal of the control module, and a third terminal in communication with the third terminal of the control module. In another embodiment, the amplifier further includes a fourth terminal configured to receive an enable signal.

In another embodiment, the energy storage module further includes a first current source, a switch and a second current source. The first current source includes a first terminal in communication with the second terminal of the energy storage module, and a second terminal. The switch includes a first terminal in communication with the second terminal of the first current source, a second terminal in communication with the first terminal of the energy storage module, and a third terminal in communication with the second terminal of the energy storage module. The second current source includes a first terminal in communication with the second terminal of the energy storage module, and a second terminal. In another embodiment, the first current source is configured to flow current at a first rate and the second current source is configured to flow current at a second rate, the second rate being less than the first rate. In another embodiment, the energy storage device is a capacitor.

BRIEF DESCRIPTION OF THE DRAWINGS

Other objects, features and advantages will occur to those skilled in the art from the following description of a preferred embodiment and the accompanying drawings, in which.

DETAILED DESCRIPTION

Figure 2:
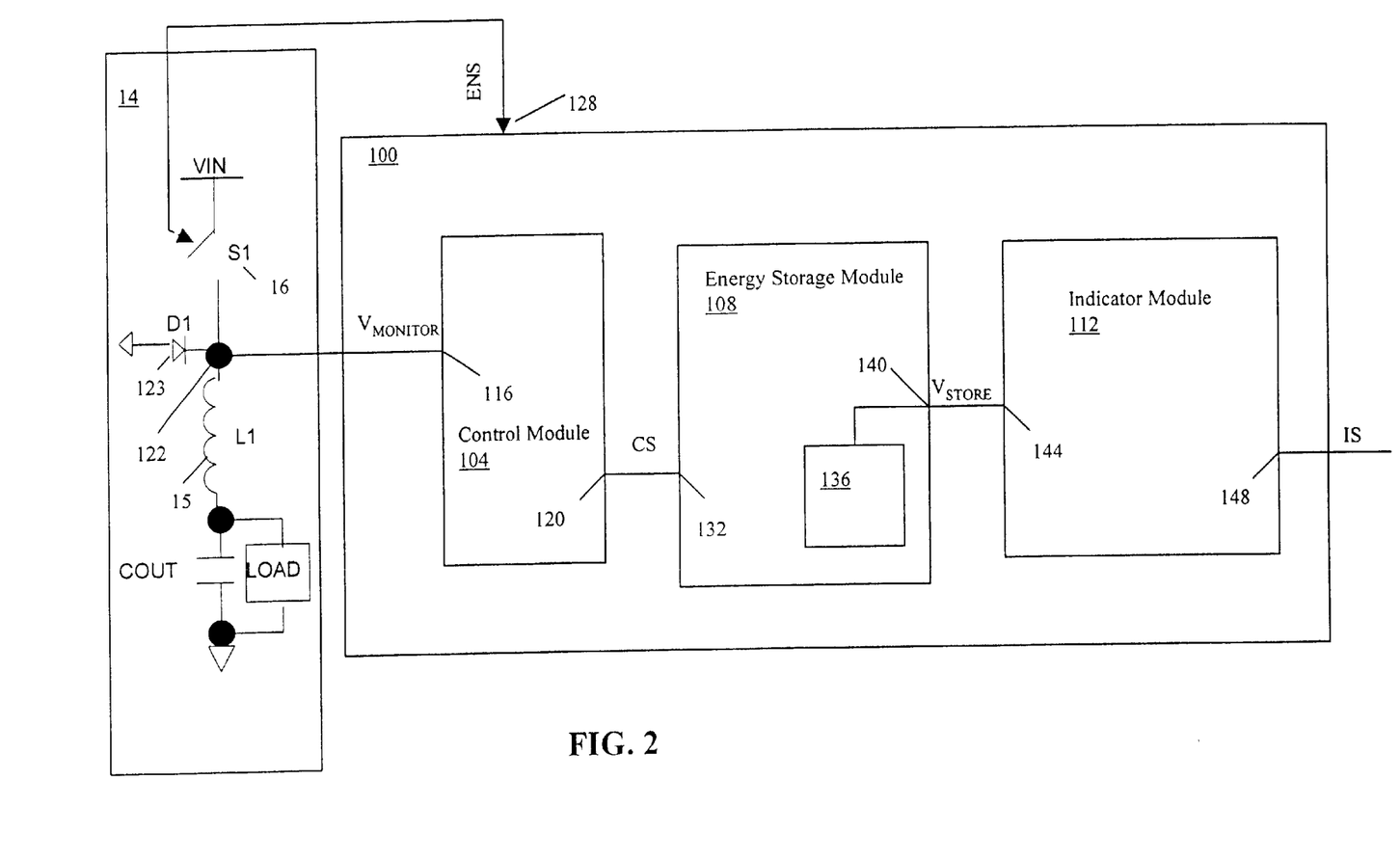
FIG. 2 is a high-level block diagram of one embodiment of an over-current detection circuit according to the invention.

FIG. 2 depicts a system 100 for indicating an over-current condition in a switching circuit 14 with a switch 16. The system 100 includes a control module 104, an energy storage module 108 and an indicator module 112. The control module 104 includes an input terminal 116 and an output terminal 120. The input terminal 116 is coupled to the switching circuit 14 at node 122 between a diode 123 and an inductor 15 to sense a monitor voltage ($V_{MONITOR}$). The system 100 determines the current flow through the switching circuit 14 using the monitor voltage ($V_{MONITOR}$) as discussed in more detail below.

In the preferred embodiment, switch 16 is a FET having a known drain-to-source "ON" resistance (e.g., RDSon). The monitor voltage ($V_{MONITOR}$) at node 122 is the input voltage ($V_{IN}$) less the voltage drop across the switch 16. (In other embodiments, the monitor voltage ($V_{MONITOR}$) is defined as (or derived from) a voltage at a different node or component in the switching circuit 14.) When the control module 104 determines an over-current condition based on the monitor voltage ($V_{MONITOR}$), the control module 104 generates a control signal (CS) at its output terminal 120. In one embodiment, the control signal (CS) includes two values that correspond to a store state and a deplete state. The system 100 can also include an optional enable terminal 128 that receives an enable signal (ENS) indicating when the switch 16 is in a closed position (e.g., "ON"). In the illustrative embodiment, when the switch 16 is not is in a closed position, the control module 104 maintains the control signal (CS) in the deplete state. In other embodiments (not shown), the enable signal ENS is representative of other states or conditions of the switching circuit 14, and is used to affect the functionality of one or more of the control module 104, the energy storage module 108 and the indicator module 112.

The energy storage module 108 includes an input terminal 132, an energy storage device 136 and an output terminal 140 connected to the energy storage device 136. The input terminal 132 of the energy storage module 108 is connected to the output terminal 120 of the control module 104 and receives the control signal (CS) generated by the control module 104. In response to the control signal (CS), the energy storage module 108 charges the energy storage device 136. The energy storage module 108 charges the energy storage device 136 when the control signal (CS) is in the store state and discharges the storage device 136 when the control signal (CS) is in the deplete state. The charging and discharging results in a time-dependent storage voltage ($V_{STORE}$) across the energy storage device 136. The energy storage module 108 provides the storage voltage ($V_{STORE}$) of the energy storage device 136 at the output terminal 140.

The indicator module 112 includes an input terminal 144 and an output terminal 148. The input terminal 144 is in communication with the output terminal 140 of the energy storage module 108 and receives the storage voltage ($V_{STORE}$). In response, the indicator module 112 generates an indication signal (IS) at the output terminal 148. The indication signal (IS) indicates whether an over-current condition exists in the switching circuit 14. In one embodiment, the indication signal (IS) includes two states that correspond to an over-current state and an in-range state of the switching circuit 14.

Figure 3:
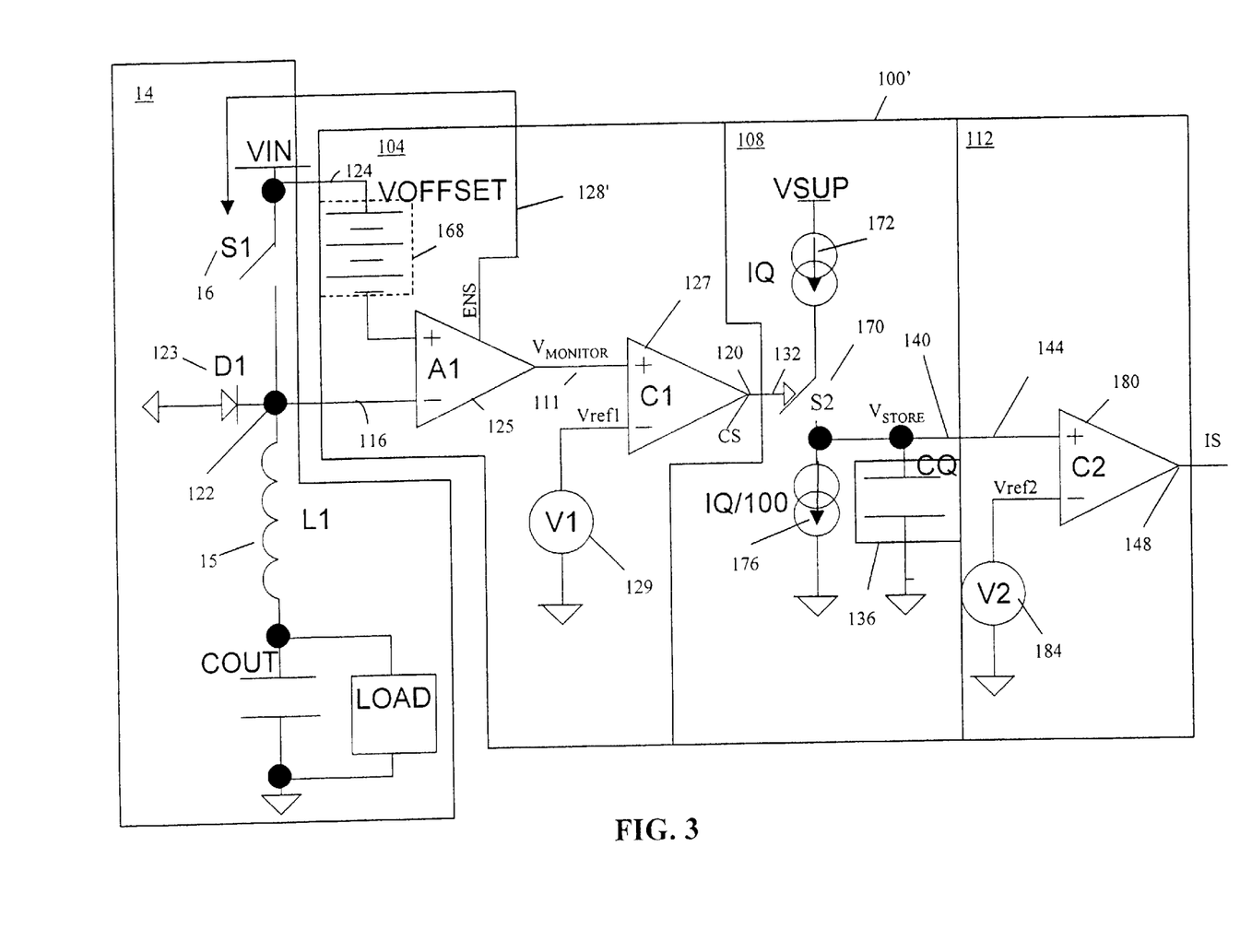
FIG. 3 is a block diagram of another embodiment an over-current detection circuit according to the invention.

FIG. 3 depicts another embodiment of a system 100' for indicating an over-current condition in a switching circuit 14. The system 100' includes a control module 104, an energy storage module 108 and an indicator module 112. The control module 104 includes an input terminal 116 and an output terminal 120, a reference voltage terminal 124 and an enable terminal 128'. The control module 104 also includes an amplifier 125 (A1), a comparator 127 (C1) and a voltage reference source 129 (V1) that generates a reference voltage (Vref1). The input terminal 116 of the control module 104 is connected to the switching circuit 14 at node 122. The voltage reference terminal 124 is connected to the switching circuit 14 at the input voltage (VIN) side of the switch 16. Optionally, the voltage reference source 129 (V1) can be external to the control module 104.

The amplifier 125 receives the voltage applied at the input terminal 116 at its negative input terminal and a voltage equal to the sum of the input voltage ($V_{IN}$) and the offset voltage ($V_{OFFSET}$) at the positive input terminal of the amplifier 125. The polarities of the amplifier 125 and all of the other components throughout the specification are for illustrative purposes only. Those skilled in the art can change polarities and provide additional logic to obtain the same results. The amplifier 125 generates the monitor voltage ($V_{MONITOR}$) at its output terminal 111 proportional to the difference between the voltages applied to the input terminals of amplifier 125. The monitor voltage ($V_{MONITOR}$) is substantially proportional to the voltage drop across the switch 16. The switch 16 is a FET having a known drain to source "ON" resistance (e.g., RDSon). Thus current through the switch 16 is the monitor voltage ($V_{MONITOR}$) divided by the known "ON" resistance of the FET.

Also shown within the control module 104' is an optional offset voltage source 168. In one embodiment, the first reference voltage (Vref1) is a fixed value corresponding to an overcurrent condition for switching circuit 14. The optional offset voltage source 168 is used to adjust the voltage applied to the positive terminal of amplifier 125 and thus compensate for the fixed (i.e., not adjustable) first reference voltage (Vref1). One skilled in the art can see that other compensation techniques can also be used.

The control module 104 includes the enable terminal 128' that receives an enable signal (ENS). The enable signal (ENS) indicates when the switch 16 is closed (e.g., "ON"). The enable signal (ENS) enables the amplifier 125 when the switch 16 is closed and disables the amplifier 125 when the switch 16 is open. Thus the comparator 127 receives at its positive terminal the monitor voltage ($V_{MONITOR}$) when the switch 16 is closed. The comparator 127 also receives a first reference voltage (Vref1) from the first voltage reference source 129 at its negative terminal. When the amplifier 125 is disabled or when the monitor voltage ($V_{MONITOR}$) is less than or equal to the first reference voltage (Vref1), the comparator 127 generates a control signal (CS) at a first voltage value. For example, the first value can be a logic low, representing that the current through the switch circuit 14 is at an in-range condition. This can also be referred to as a deplete state, an in-range state and the like. When the amplifier 125 is enabled and the monitor voltage ($V_{MONITOR}$) is greater than the first reference voltage (Vref1), the comparator 127 generates the control signal (CS) at a second voltage value. For example, the second value can be a logic high, representing that the current through the switch circuit 14 is at an out-of-range condition. This can also be referred to as a store state, an over-current state and the like. The control module 104 provides the control signal (CS) generated by the comparator 127 at its output terminal 120.

The energy storage module 108 includes an input terminal 132, an output terminal 140, an energy storage device 136, a switch 170, a first current source 172 and a second current source 176. In the embodiment shown, the energy storage device 136 is a capacitor. The input terminal 132 is connected to the output terminal 120 of the control module 104 and receives the control signal (CS). The switch 170 is connected between the first current source 172 and the energy storage device 136. The second current source 176 is also connected to the energy storage device 136. The control signal (CS) opens or closes the switch 170, depending on the value of the control signal (CS).

In the embodiment shown the energy storage module 108 charges and discharges the energy storage device 136' using the switch 170, the first current source 172 and the second current source 176. The energy storage module 108 opens switch 170 in response to the control signal (CS) being at a first value (e.g., a deplete state) and closes switch 170 in response to the control signal (CS) being at a second value (e.g., a store state). While the switch 170 is closed, the first current source 172 supplies current to the energy storage device 136. Consequently, the charge on the energy storage device 136 increases and the magnitude of the voltage ($V_{STORE}$) at the output terminal 140 of the energy storage module 108 increases. In FIG. 3, IQ represents the rate (i.e., magnitude of the current) at which charge is supplied to the energy storage device 136. The increase in the magnitude of voltage ($V_{STORE}$) is dependent on the time during which the first current source 172 is connected to the energy storage device 136 and the current IQ (i.e., the rate at which charge is supplied).

The second current source 176 conducts current from the energy storage device 136 to ground, thus decreasing the charge on the energy storage device 136 and the voltage ($V_{STORE}$) across the energy storage device 136. In FIG. 3, IQ/100 represents the rate at which charge is removed from the energy storage device 136. Thus, the second current supply 176 conducts current from the energy storage device 136 at a rate that is approximately one one-hundredth of the charging rate IQ of the first current source 172. The depletion rate of IQ/100 is illustrative only and is determined by design requirements. The net charge on the energy storage device 136 is dependent on the charging rate IQ of the first current source 172, the discharge rate of the second current source 176 and the time that switch 170 is in a closed position.

The indicator module 112 includes an input terminal 144, an output terminal 148, a comparator 180 and a voltage reference source 184. The input terminal 144 is connected to the output terminal 140 of the energy storage module 108 and receives the storage voltage ($V_{STORE}$). The indicator module 112 applies the received storage voltage ($V_{STORE}$) to the positive terminal of comparator 180. The comparator 180 receives at its negative terminal a second reference voltage (Vref2) from the voltage reference source 184. When the received storage voltage ($V_{STORE}$) is less than or equal to the second reference voltage (Vref2), the comparator 180 generates an indication signal (IS) at a first value at the output terminal 148 of the indication module 112. For example, the first voltage can be a logic low, representing an in-range state and the like. When the storage voltage ($V_{STORE}$) is greater than the second reference voltage (Vref2), the comparator 180 generates an indication signal (IS) at a second value. For example, the second state can be a logic high, representing an over-current state and the like.

Figure 4:
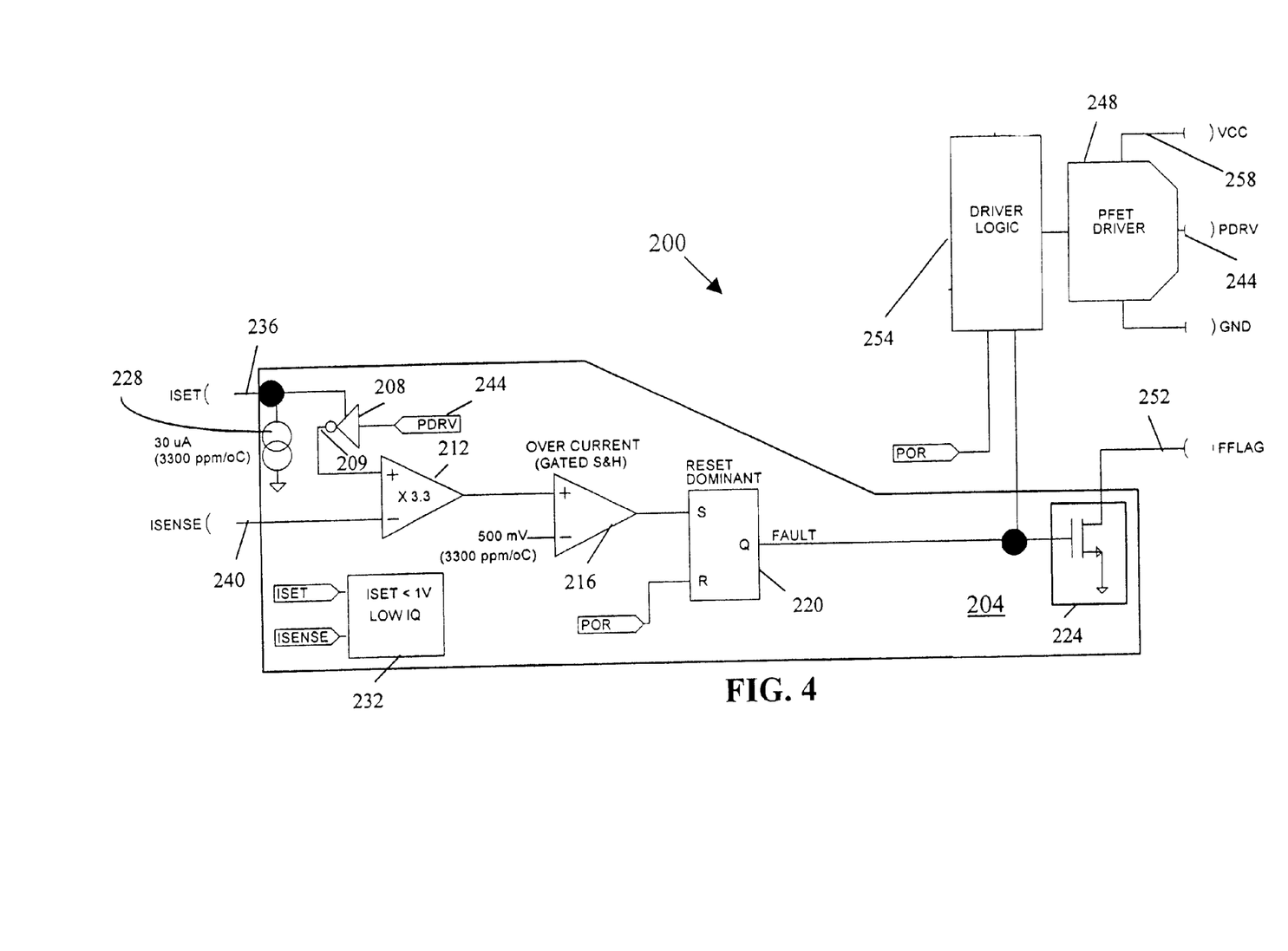
FIG. 4 is a high-level block diagram of one embodiment an over-current detection circuit according to the invention used in an integrated circuit.

FIG. 4 depicts an integrated circuit 200 with an over-current circuit 204 for indicating an over-current condition in an external switching circuit. The over-current circuit 204 includes an enable inverter 208, an amplifier 212, a gated sample and hold module 216, a set/reset flip-flop 220, a signal driver 224, a current source 228 and a shutdown module 232. The ISENSE voltage signal applied to terminal 236 of the over-current circuit 204 is the monitor voltage ($V_{MONITOR}$) of the external switching circuit, corresponding to the current flowing through the switching circuit. The ISET voltage signal applied to terminal 240 of the over-current circuit 204 is a threshold voltage corresponding to the maximum allowable current flow under normal operating conditions.

The amplifier 212 receives the ISENSE voltage at its negative terminal and the ISET voltage at its positive terminal. The amplifier 212 generates approximately 3.3 times the difference of the ISET voltage and the ISENSE voltage. However, the amplifier 212 only receives the ISET voltage when the enable inverter 208 is enabled, which is when the PDRV signal 244 is a logic low. The ISET voltage is the supply voltage for the enable inverter 208. When the PDRV signal 244 is a logic low, the enable inverter 208 provides this supply voltage (i.e., ISET voltage) at its output terminal 209. In this embodiment, the PDRV signal 244 is a logic low when the PFET driver circuit 248 is commanding the PFET switch of the external switching circuit (not shown) to an "ON" state.

The gated sample and hold module 216 receives the voltage generated by the amplifier 212 at its positive terminal. The gated sample and hold module 216 receives a reference voltage of 0.5 volts at its negative terminal. The voltage received at the positive and negative terminals of the gated sample and hold module 216 control the charging and discharging of a sampling capacitor (not shown) within the gated sample and hold module 216. As illustrated, the gated sample and hold module 216 charges the sampling capacitor each time the ISET voltage minus the ISENSE voltage exceeds approximately 150 mV and the PDRV voltage 244 is a logic low. The discharge current of the sampling capacitor within the gated sample and hold module 216 is approximately two percent of the charge current. Therefore, provided that the over-current condition persists, the charge on the sampling capacitor voltage (i.e., $V_{STORE}$) increases each time PDRV voltage 244 switches low. This storage voltage ($V_{STORE}$) triggers an over-current condition upon reaching a threshold voltage necessary to change the state of a CMOS inverter (not shown) within the gated sample and hold module 216. When the gated sample and hold module 216 triggers this over-current condition, the set/reset flip-flop 220 is latched. The set/reset flip-flop 220 generates a FAULT signal in an over-current state (e.g., logic low). The latching of the set/reset flip-flop 220 to an over-current state causes the signal driver 224, in this embodiment a FET, to conduct current, thereby indicating an over-current condition on the FFLAG terminal 252. The driver logic 254 also receives the FAULT signal of the flip-flop 220. In one embodiment, the logic driver 254 uses the FAULT signal to control the switching device. The shutdown module 232 monitors the ISET voltage signal. When the ISET voltage signal is less than one volt (e.g., near ground), the shutdown module 232 inactivates the over-current circuit 204. This reduces the quiescent current needed by the integrated circuit 200.

Although the 150 mV threshold is fixed, the overall RDSon detection voltage can be increased by placing a resistor from ISET voltage terminal 236 to the VCC terminal 258. A 30 uA current source 228 programs the additional voltage. In one embodiment, the 150 mV threshold and 30 $\mu$A ISET current have 3300 ppm/° C. temperature coefficients in an effort to match the thermal characteristics of the PFET switch. The integrated circuit 200 is useful in compact designs in which there is significant thermal coupling between the PFET switch and the controller.

Figure 5:
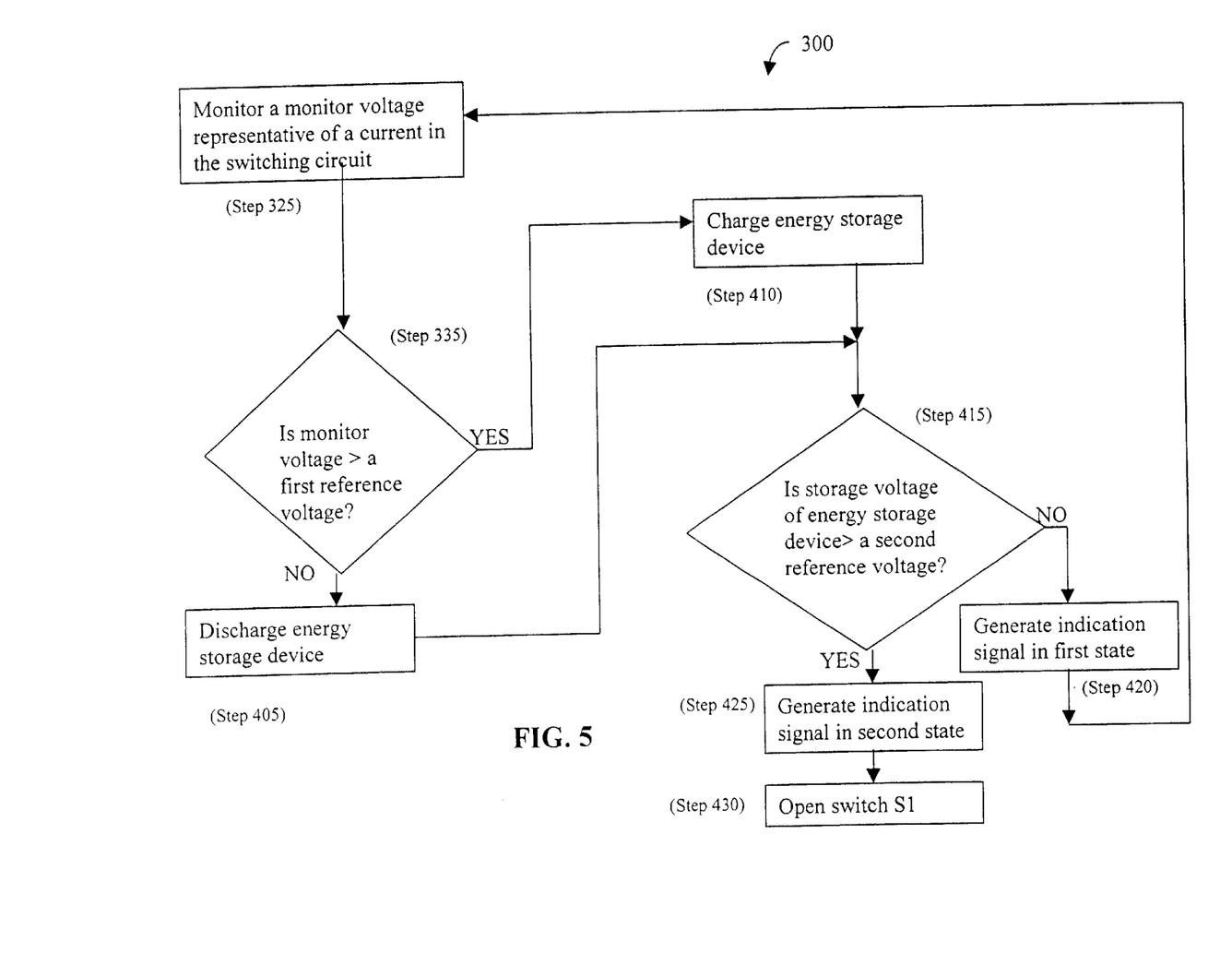
FIG. 5 is a flow diagram of one embodiment a method for indicating an over-current detection condition according to the invention.

FIG. 5 depicts a flow diagram of one embodiment of a process 300 to indicate an over-current condition in a switching circuit. The system monitors (step 325) a monitor voltage from the switching circuit. Monitoring can include, for example, directly monitoring one or more voltages within the switching circuit. Monitoring can also include, sensing one or more voltages within the switching circuit and deriving (e.g., adding, subtracting, combining proportionally, and the like) a monitor voltage from the one or more switching circuit voltages. The system determines (step 335) whether the monitor voltage is above a threshold (e.g., a first reference voltage). If the system determines that the monitor voltage is less than or equal to the first reference voltage, the system discharges (step 405) an energy storage device. If the system determines that the monitor voltage is greater than the first reference voltage, the system charges (step 410) the energy storage device. In one embodiment the rate of charging the energy storage device is greater than the rate of discharging the energy storage device.

The effect of charging and discharging the energy storage device is a net charge on the energy storage device. The net charge results in a storage voltage across the energy storage device. The system determines (step 415) whether the storage voltage is above a threshold (i.e., a second reference voltage). If the system determines that the storage voltage is less than or equal to the second reference voltage, the system generates (step 420) an indication signal at a first state. For example, the first state can be a logic low, representing an in-range state condition and the like. If the system determines that the storage voltage is greater than the second reference voltage, the system generates (step 425) an indication signal at a second state. For example, the second state can be a logic high, representing an over-current state and the like. The indication signal in the second state is used to open (step 430) switch S1 when there is an over-current condition, thereby preventing continued operation at an unacceptable current level.

Figure 6:
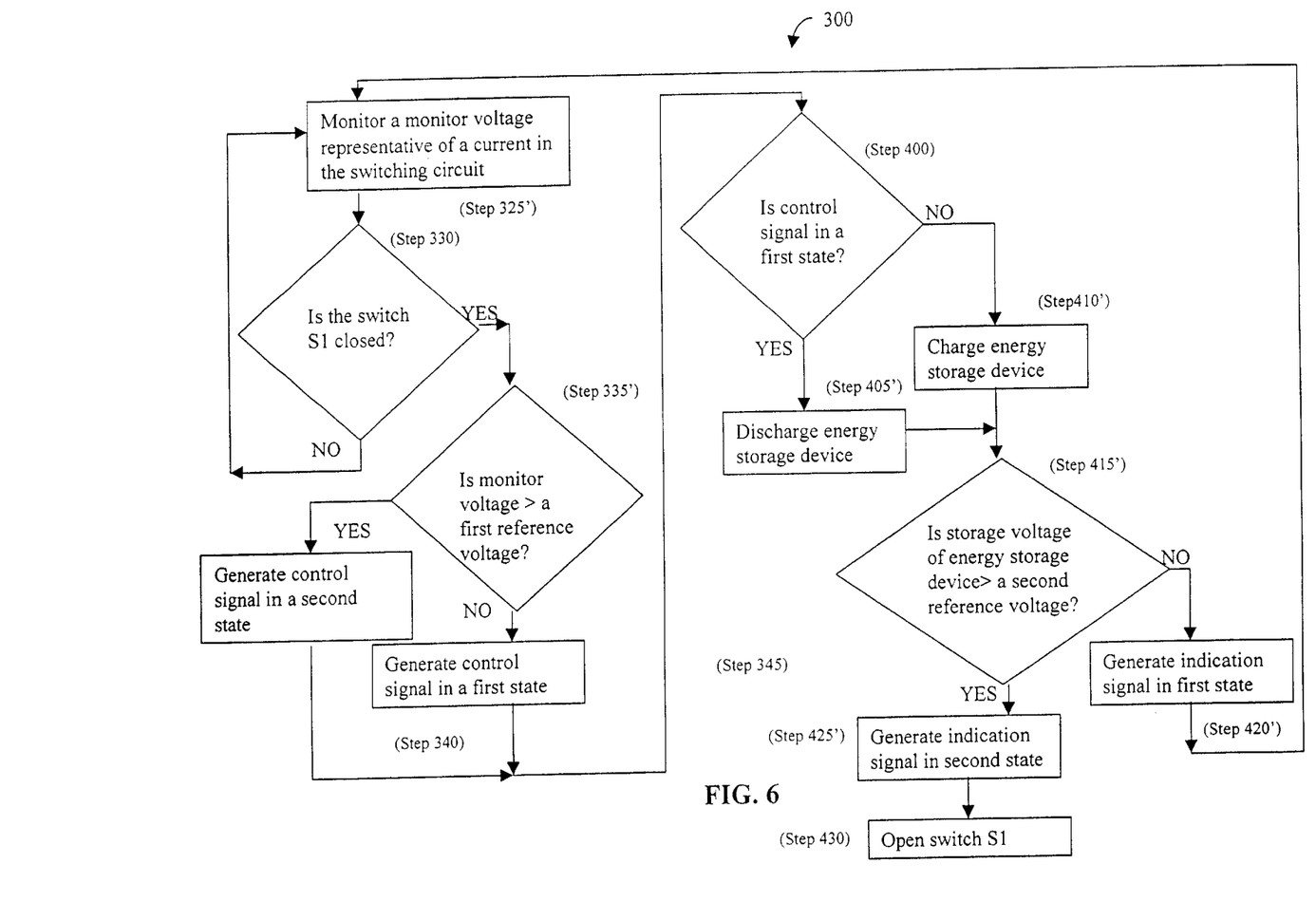
FIG. 6 is a flow diagram of another embodiment a method for indicating an overcurrent detection condition according to the invention.

FIG. 6 depicts a flow diagram of another embodiment of a process 300' to indicate an over-current condition in a switching circuit.

To generate a control signal, the system monitors (step 325') a monitor voltage from the switching circuit. In the illustrated embodiment, the process 300' uses an enable signal as part of the process 300' of generating the control signal. The enable signal corresponds to the status of the switch S1 (e.g., open or closed, on or off, and the like) in the switching circuit. The system determines (step 330) whether the switch S1 is closed (e.g., "ON", or conducting current). If the system determines that the switch S1 is open, the system continues to monitor (step 325') the monitor voltage. If the system determines that the switch S1 is closed, the system proceeds to compare (step 335') the monitor voltage and a threshold voltage (i.e., a first reference voltage).

If the system determines (step 335') that the monitor voltage is less than or equal to the first reference voltage, the system generates (step 340) a control signal at a first state. For example, the first state can be a logic low, representing a deplete state, an in-range state and the like. If the system determines that the monitor voltage is greater than the first reference voltage, the system generates (step 345) a control signal at a second state. For example, the second state can be a logic high, representing a store state, an over-current state and the like.

The method proceeds to determine (step 400) whether the control signal is at the first state (e.g., the deplete state). If the system determines that the control signal is in the first state, the system discharges (step 405') an energy storage device. If the system determines that the control signal is not in the first state, the system charges (step 410') the energy storage device. In one embodiment the rate of charging the energy storage device is greater than the rate of discharging the energy storage device.

The effect of charging and discharging the energy storage device is a net charge on the energy storage device. The net charge corresponds to a storage voltage across the energy storage device. The system determines (step 415') whether the storage voltage is above a threshold (e.g., a second reference voltage). If the system determines that the storage voltage is less than or equal to the second reference voltage, the system generates (step 420') an indication signal in a first state. For example, the first value can be a logic low, representing an in-range state and the like. If the system determines that the monitor voltage is greater than the second reference voltage, the system generates (step 425') an indication signal in a second state. For example, the second state can be a logic high, representing an over-current state and the like. The indication signal is used to open (step 430) switch S1 when there is an over-current condition in the switching circuit, thereby preventing further operation at unacceptable current level.

The invention may be embodied in other specific forms without departing from the spirit or essential characteristics thereof. For example, all polarities of logic and voltage signals are shown to represent such polarities in a single functional embodiment. One skilled in the art can easily choose different polarities and arrange the specific components and logic accordingly. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are therefore intended to be embraced therein.

What is claimed is:

1. A method to indicate an over-current condition in a switching circuit, the method comprising:
    monitoring a monitor voltage from the switching circuit;
    charging an energy storage device in response to the monitor voltage and a reference voltage; and
    generating an indication signal in response to the charging of the storage device.

2. The method of claim 1 wherein the step of charging further comprises:
    charging the energy storage device at a charge rate in response to the monitor voltage and a reference voltage, and
    discharging the energy storage device at a discharge rate.

3. The method of claim 2 wherein the discharge rate is less than the charge rate.

4. The method of claim 1 further comprising receiving an enable signal, wherein the charging step comprises charging the energy storage device in response to the monitor voltage, the reference voltage and the enable signal.

5. The method of claim 4 further comprising generating the enable signal when a switching device within the switching circuit is in a closed state.

6. The method of claim 1 further comprising determining the monitor voltage in response to a voltage drop across a switching device in the switching circuit.

7. The method of claim 1 wherein the generating step further comprises generating an indication signal in response a storage voltage of the energy storage device exceeding a second reference voltage.

8. The method of claim 1 further comprising controlling the switching circuit in response to the indication signal.

9. The method of claim 8 wherein the switching circuit is a synchronous, DC to DC converter.

10. A system to indicate an over-current condition in a switching circuit, the system comprising:
    a control module having a first terminal configured to receive a monitor voltage from the switching circuit, and a second terminal, the control module generating at the second terminal a control signal in response to the monitor voltage and a first reference voltage;
    an energy storage module comprising a first terminal in communication with the second terminal of the control module, a second terminal, and an energy storage device in communication with the second terminal of the energy storage module, the energy storage device being charged in response to the control signal thereby generating a storage voltage at the second terminal; and
    an indicator module having a first terminal in communication with the second terminal of the energy storage module, and a second terminal, the indicator module generating at the second terminal an indication signal in response to the charge signal.

11. The system of claim 10 wherein the control module further comprises a third terminal configured to receive an enable signal, the control module generating at the second terminal a control signal in response to the monitor voltage, the first reference voltage and the enable signal.

12. The control module of claim 10 wherein the monitor voltage is a first monitor voltage, the control module further comprising:
    a third terminal configured to receive a second monitor voltage;
    an amplifier including a first terminal in communication with the first terminal of the control module, a second terminal in communication with the third terminal of the control module, and a third terminal; and
    a comparator including a first terminal in communication with the third terminal of the amplifier, a second terminal in communication with the second terminal of the control module, and a third terminal in communication with the third terminal of the control module.

13. The amplifier of claim 12 further comprising a fourth terminal configured to receive an enable signal.

14. The system of claim 10 wherein the energy storage module further comprises:
    a first current source including a first terminal in communication with the second terminal of the energy storage module, and a second terminal;
    a switch including a first terminal in communication with the second terminal of the first current source, a second terminal in communication with the first terminal of the energy storage module, and a third terminal in communication with the second terminal of the energy storage module; and
    a second current source including a first terminal in communication with the second terminal of the energy storage module, and a second terminal.

15. The system of claim 14 wherein the first current source is configured to provide charge at a first rate and the second current source is configured to provide charge at a second rate, the second rate being less than the first rate.

16. The system of claim 10 wherein the energy storage device is a capacitor.

17. The system of claim 10 wherein the switching device is part of a switching regulator and the system is furthered configured to control the switching device in response to the indication signal.

18. The system of claim 17 wherein the switching regulator is a synchronous, DC to DC converter.

19. A system to indicate an over-current condition in a switching circuit, the system comprising:
    a means for monitoring a monitor voltage from the switching circuit;
    a means for charging an energy storage device in response to the monitor voltage and a reference voltage; and
    a means for generating an indication signal in response to the charging of the storage device.

20. The system of claim 19 wherein the means for charging further comprises:

a means for charging the energy storage device at a charge rate in response to the monitor voltage and a reference voltage, and a means for discharging the energy storage device at a discharge rate.

21. The system of claim 20 wherein the discharge rate is less than the charge rate.

22. The system of claim 19 further comprising a means for receiving an enable signal, wherein the means for charging comprises a means for charging the energy storage device in response to the monitor voltage, the reference voltage and the enable signal.

23. The system of claim 19 wherein the means for generating comprises a means for generating an indication signal in response a storage voltage of the energy storage device exceeding a second reference voltage.

* * * * *

UNITED STATES PATENT AND TRADEMARK OFFICE
CERTIFICATE OF CORRECTION

PATENT NO. : 6,570,748 B2
DATED : May 27, 2003
INVENTOR(S) : Sanzo

It is certified that error appears in the above-identified patent and that said Letters Patent is hereby corrected as shown below:

Column 10,
Line 52, replace "furthered" with -- further --.

Column 12,
Line 6, immediately following "response" insert -- to --.

Signed and Sealed this

Twelfth Day of August, 2003

JAMES E. ROGAN
*Director of the United States Patent and Trademark Office*